(12) United States Patent  (10) Patent No.: US 8,411,494 B2
Shukh  (45) Date of Patent: Apr. 2, 2013

(54) THREE-DIMENSIONAL MAGNETIC RANDOM ACCESS MEMORY WITH HIGH SPEED WRITING

(76) Inventor: Alexander Mikhailovich Shukh, Savage, MN (US)

( * ) Notice: Subject to any disclaimer, the term of this patent is extended or adjusted under 35 U.S.C. 154(b) by 181 days.

(21) Appl. No.: 12/837,503

(22) Filed: Jul. 16, 2010

(65) Prior Publication Data

US 2012/0155154 A1    Jun. 21, 2012

Related U.S. Application Data

(60) Provisional application No. 61/227,364, filed on Jul. 21, 2009.

(51) Int. Cl.
*G11C 11/00* (2006.01)
(52) U.S. Cl. ......... 365/158; 365/148; 365/171; 977/935
(58) Field of Classification Search ............... 365/48, 365/55, 62, 66, 74, 78, 80–93, 100, 130, 365/131, 148, 158, 171–173, 209, 213, 225.5, 365/230.07, 232, 243.5; 216/22; 257/295, 257/421, E21.665; 438/3; 428/810–816, 428/817–825.1, 826; 977/933–935
See application file for complete search history.

(56) References Cited

U.S. PATENT DOCUMENTS

| | | | |
|---|---|---|---|
| 5,695,864 A | 12/1997 | Slonczewski | |
| 6,721,201 B2 | 4/2004 | Ikeda | |
| 6,801,451 B2 | 10/2004 | Tran et al. | |
| 6,844,605 B2 | 1/2005 | Nishimura | |
| 6,845,038 B1 | 1/2005 | Shukh | |
| 6,950,333 B2 | 9/2005 | Hiramoto et al. | |
| 7,006,375 B2 | 2/2006 | Covington | |
| 7,224,601 B2 | 5/2007 | Panchula | |
| 7,307,302 B2 | 12/2007 | Saito | |
| 7,420,839 B2 | 9/2008 | Ikeda et al. | |
| 7,432,574 B2 | 10/2008 | Nakamura et al. | |
| 7,440,339 B2 | 10/2008 | Nejad et al. | |
| 7,463,509 B2 | 12/2008 | Kim et al. | |
| 7,502,248 B2 | 3/2009 | Lim | |
| 7,508,042 B2 | 3/2009 | Guo | |
| 7,511,991 B2 | 3/2009 | Saito et al. | |

(Continued)

OTHER PUBLICATIONS

M. Nakayama et al., Spin transfer switching in TbCoFe/CoFeB/MgO/CoFeB/TbCoFe magnetic tunnel junctions with perpendicular magnetic anisotropy, JAP, v. 103. 07A710 (2008).

(Continued)

*Primary Examiner* — Harry W Bryne

(57) ABSTRACT

One embodiment of a magnetic random access memory includes a transistor formed on a substrate and having a gate width, a plurality of magnetoresistive elements disposed above the transistor and jointly electrically coupled to the transistor at their first terminals, a plurality of parallel conductive lines formed above magnetoresistive elements and independently electrically coupled to their second terminals. A magnetoresistive element includes, a pinned layer having a fixed magnetization direction, a free layer having a reversible magnetization direction, a tunnel barrier layer disposed between the free and pinned layers, and an element width that is substantially smaller than the gate width. The magnetization directions of the pinned and free layers are directed substantially perpendicular to the substrate. The magnetization direction of the free layer is reversed by a joint effect of a bias magnetic field and a spin-polarized current applied to the magnetoresistive element. Other embodiments are described and shown.

15 Claims, 8 Drawing Sheets

U.S. PATENT DOCUMENTS

| | | | |
|---|---|---|---|
| 7,532,505 | B1 | 5/2009 | Ding |
| 7,668,005 | B2 * | 2/2010 | Ueda .............................. 365/158 |
| 2005/0083747 | A1 * | 4/2005 | Tang et al. .................... 365/210 |
| 2007/0086121 | A1 | 4/2007 | Nagase et al. |
| 2007/0215967 | A1 | 9/2007 | Wu et al. |
| 2008/0037314 | A1 * | 2/2008 | Ueda .............................. 365/158 |

OTHER PUBLICATIONS

H. Ohmori et al., Perpendicular magnetic tunnel junction with tunneling magnetoresistance ratio of 64% using MgO . . . , JAP vol. 103, 07A911 (2008).

Z. Li et al., Perpendicular Spin Torques in Magnetic Tunnel Junctions, Physical Review Letters, vol. 100, 246602 (2008).

T. Hatori et al., MTJ Elements With MgO Barrier Using RE-TM Amorphous Layers for Perpendicular MRAM, IEEE Trans. Magn., v. 43. No. 6, p. 2331 (2007).

X. Zhu and J.-G. Zhu, Spin Torque and Field-Driven Perpendicular MRAM Designs Scalable to Multi-Gb/Chip Capacity, IEEE Trans. Magn: v.42, No. 10, p. 2739 (2006).

Z. Diao et al., Spin transfer switching and spin polarization in magnetic tunnel junctions with MgO and Al2O3 barriers, App. Phys. Letters, v. 87, 232502 (2005).

* cited by examiner

THREE-DIMENSIONAL MAGNETIC RANDOM ACCESS MEMORY WITH HIGH SPEED WRITING

CROSS-REFERENCE TO RELATED APPLICATION

This application claims benefit of U.S. Provisional Patent Application No. 61/227,364 entitled "3D Magnetic Random Access Memory with High Speed Writing" filed Jul. 21, 2009, which is hereby incorporated by reference in its entirety.

FEDERALLY SPONSORED RESEARCH

Not Applicable

SEQUENCE LISTING OR PROGRAM

Not Applicable

FIELD OF THE APPLICATION

The present application relates to a magnetic random access memory (MRAM) and, more specifically, to a perpendicular MRAM with high-speed writing that can be arranged in a three-dimensional architecture.

BACKGROUND

Magnetic random access memory (MRAM) is a new memory technology that will likely provide a superior performance over existing semiconductor memories including flash memory and may even replace hard disk drives in certain applications requiring a compact non-volatile memory device. In MRAM bit of data is represented by a magnetic configuration of a small volume of ferromagnetic material and its magnetic state that can be measured during a read-back operation. The MRAM typically includes a two-dimensional array of memory cells wherein each cell comprises one magnetic tunnel junction (MTJ) (or magnetoresistive (MR)) element that can store at least one bit of data, one selection transistor (T) and intersecting conductor lines (so-called 1T-1MTJ design).

Conventional MTJ element represents a patterned thin film multilayer that includes at least a pinned magnetic layer and a free magnetic layer separated from each other by a thin tunnel barrier layer. The free layer has two stable directions of magnetization that are parallel or anti-parallel to the fixed direction of the magnetization in the pinned layer. Resistance of the MTJ depends on a mutual orientation of the magnetizations in the free and pinned layers and can be effectively measured. A resistance difference between the parallel and anti-parallel states of the MTJ can exceed 600% at room temperature.

The direction of the magnetization in the free layer may be changed from parallel to anti-parallel or vice-versa by applying two orthogonal magnetic fields to the selected MTJ, by passing a spin-polarized current through the selected junction in a direction perpendicular to the junction plane, or by using a hybrid switching mechanism that assumes a simultaneous application of the external magnetic field and spin-polarized current to the selected MTJ. The hybrid switching mechanism looks the most attractive among all others since it can provide good cell selectivity in the array, relatively low switching current and high write speed.

FIGS. 1A and 1B show a schematic cross-sectional and top down views of MRAM cell 10 employing the hybrid switching mechanism according to a prior art disclosed in U.S. Pat. No. 7,006,375 (Covington). The cross-section was taken alone the line 1A-1A shown in the FIG. 1B. The memory cell 10 includes a semiconductor wafer 11 with a selection transistor 12, MTJ element 21, a word line 16 and a bit line 19 that are orthogonal to each other (1T-1MTJ design). The bit line 19 and the MTJ element 21 are connected in series to a source region 13 of the selection transistor 12. The MTJ element 21 includes a pinned magnetic layer 22 with a fixed in-plane magnetization direction (shown by an arrow), a free magnetic layer 23 with a changeable in-plane magnetization direction (shown by arrows), a thin tunnel barrier layer 24 positioned between the free 23 and pinned 22 layers, and a pinning anti-ferromagnetic layer 25 exchange coupled with the pinned layer 22. The MTJ element 21 has an elliptical shape with a major axis of the ellipse being oriented in parallel to the word line 19. An easy magnetic axis of the pinned and free layers coincides with the major axis. The transistor 12 comprises a gate 15 having a width W of about a width F of the MTJ element 21 (W=F). A drain region 14 of the transistor 12 is connected to a ground line 18 through a contact plug 17.

To write a data to the MTJ element 21, a bias electric current $I_B$ is applied to the bit line 19. The current $I_B$ induces a magnetic bias field $H_B$ that affects the free layer 23 along its hard magnetic axis. The field $H_B$ forces the magnetization direction in the free layer 23 from its equilibrium state that is parallel to the major axis of the MTJ element 21. By applying a voltage to the gate 15 through the word line 16 the selection transistor 12 can be turned on. The transistor 12 delivers a spin-polarized current $I_s$ to the MTJ element 21. The current $I_S$ running through the element 21 produces a spin momentum transfer that together with the bias field $H_B$ provides a reversal of the magnetization direction in the free layer 23. The magnetization direction in the free layer 23 is controlled by a direction of the spin-polarized current $I_s$. Magnitude of the spin-polarized current $I_s$ required to reverse the magnetization in the free layer 23 depends on the strength of the bias field $H_B$ that tilts the magnetization direction in the free layer relatively its equilibrium state. The switching current $I_s$ can be reduced more than twice by the relatively small bias magnetic field $H_B$.

The MTJ with in-plane magnetization direction requires a high magnitude of the switching current $I_s$ even with applied magnetic bias field $H_B$. Magnitude of the spin-polarized current $I_s$ defines a write speed of the memory cell; the speed increases with the current. The spin-polarized current $I_s$ of the cell 10 is limited by a saturation current of the transistor 12 that is proportional to a gate width W. The selection transistor 12 has the gate width W=comparable to the width F of the elliptical MTJ element 21. This gate width is incapable to deliver the required magnitude of the current $I_s$. To overcome the above obstacles the gate width W of the transistor 12 needs to be substantially increased. However that will result in considerable increase of memory cell size and in MRAM density reduction.

Majority of the current MRAM designs uses the free and pinned layers made of magnetic materials with in-plane anisotropy. The in-plane MRAM (i-MRAM) suffers from a large cell size, low thermal stability, poor scalability, necessity to use MTJ with a special elliptical shape, and from other issues, which substantially limit a possibility of i-MRAM application at technology nodes below 90 nm.

MRAM with a perpendicular direction of the magnetization in the free and pinned layers (p-MRAM) does not suffer from the above problems since perpendicular magnetic materials have a high intrinsic crystalline anisotropy. The high anisotropy provides the p-MRAM with the excellent thermal stability and scalability, and with a possibility to use junctions of any shape. Nevertheless the existing p-MRAM designs have a large cell size and require a relatively high switching current.

What is needed is a simple design of p-MRAM having a high switching speed at low current, small cell size, high capacity and excellent scalability.

SUMMARY

The present application provides a three-dimensional magnetic random access memory (3D-MRAM) with a perpendicular magnetization for high-speed writing.

In accordance with one embodiment a magnetic random access memory comprises a substrate, a plurality of transistors formed on the substrate and arranged in a matrix, each transistor comprising a gate width; a memory layer formed on the substrate and comprising a plurality of memory cells arranged in the matrix, each memory cell overlaid a transistor and comprising a plurality of magnetoresistive elements jointly electrically coupled to the transistor at first terminals, each magnetoresistive element comprising an element width, a pinned ferromagnetic layer comprising a fixed magnetization direction directed substantially perpendicular to the substrate, a free ferromagnetic layer comprising a reversible magnetization direction directed substantially perpendicular to the substrate in an equilibrium state, a tunnel barrier layer disposed between the pinned and free ferromagnetic layers; and a plurality of parallel conductive lines disposed above the memory layer and independently electrically coupled to second terminals of the magnetoresistive elements, wherein the gate width is substantially larger than the element width.

In accordance with another embodiment a method of writing to a magnetic random access memory includes providing a substrate, a transistor formed on the substrate and comprising a gate width, a memory cell disposed above the transistor and comprising a plurality of magnetoresistive elements jointly electrically coupled to the transistor at first terminals, each magnetoresistive element comprising an element width, a pinned ferromagnetic layer disposed adjacent to a first terminal and comprising a fixed magnetization direction directed substantially perpendicular to the substrate, a free ferromagnetic layer disposed adjacent to a second terminal and comprising a reversible magnetization direction directed substantially perpendicular to the substrate in an equilibrium state, a tunnel barrier layer disposed between the pinned and free ferromagnetic layers, and a plurality of parallel conductive lines independently electrically coupled to second terminals of the magnetoresistive elements; driving a bias current through a conductive line for producing a bias magnetic field directed along a hard magnetic axis of the free ferromagnetic layer; and driving a spin-polarized current through the magnetoresistive element between the first and second terminals in a direction perpendicular to the substrate for producing a spin momentum transfer. The magnetization direction of the free ferromagnetic layer is reversed by a joint effect of the bias and spin-polarized currents applied simultaneously.

DESCRIPTION OF THE PREFERRED EMBODIMENTS

In the following detailed description of the embodiments, reference is made to the accompanying drawings that form a part hereof, and in which are shown be way of illustration specific embodiments in which the application may be practiced. It is understood that other embodiments may be utilized and structural changes may be made without departing from the scope of the present application.

The leading digits of reference numbers appearing in the Figures generally corresponds to the Figure number in which that component is first introduced, such that the same reference number is used throughout to refer to an identical component which appears in multiple Figures.

Figure 1A:
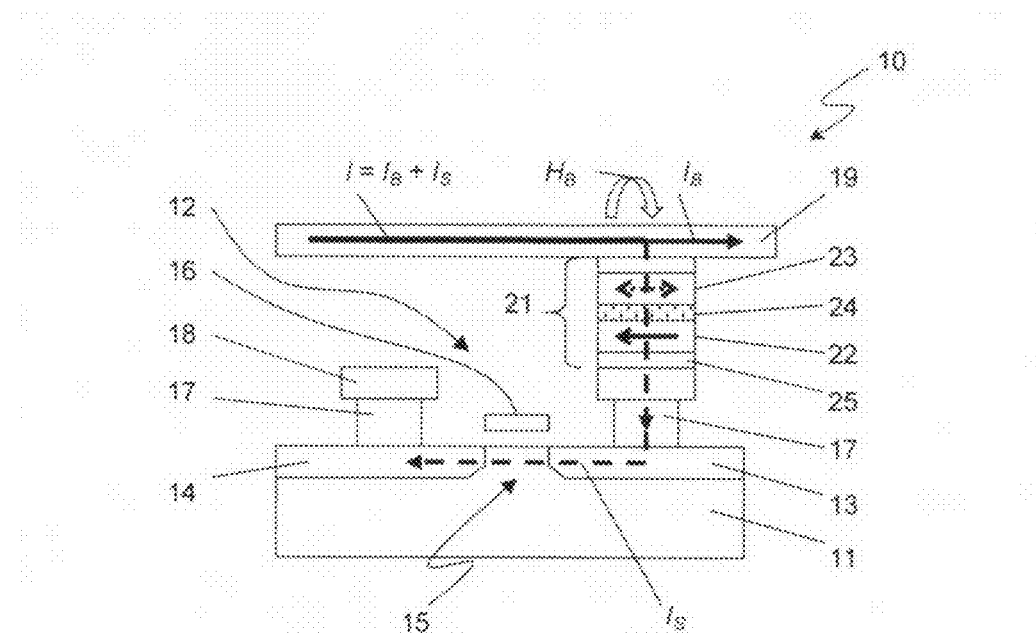
FIG. 1A illustrates a schematic cross-section view of MRAM cell with in-plane magnetization in free and pinned layers employing a hybrid write mechanism according to a prior art.
Figure 1B:
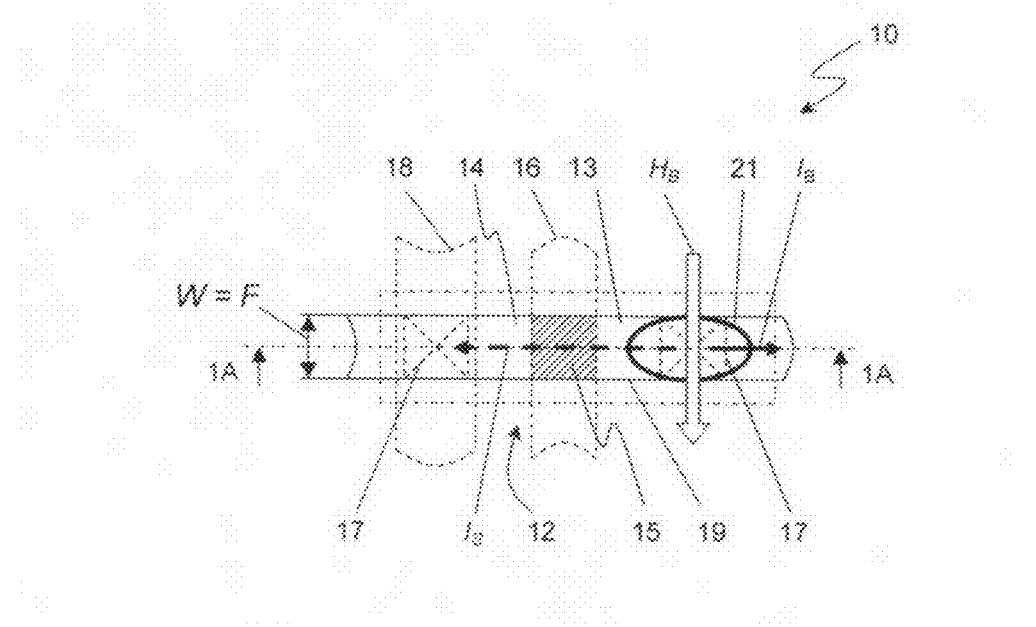
FIG. 1B is a schematic top-down view of the MRAM cell of FIG. 1A.
Figure 2A:
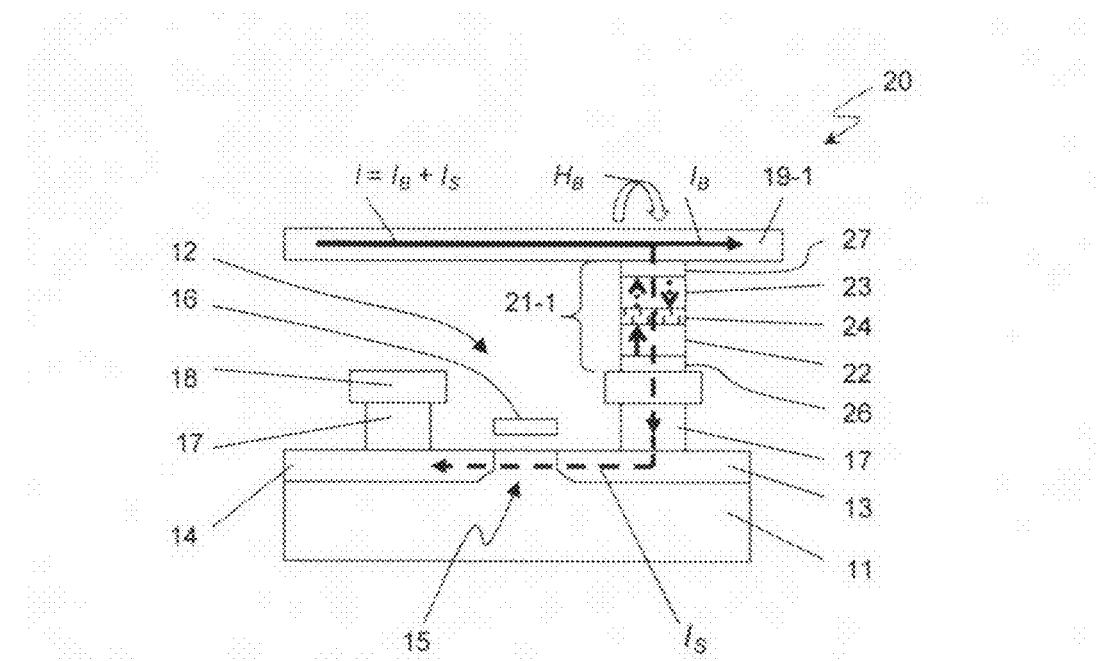
FIG. 2A. is a schematic cross-sectional view of a perpendicular MRAM cell with a hybrid write mechanism according to an embodiment of the present application.
Figure 2B:
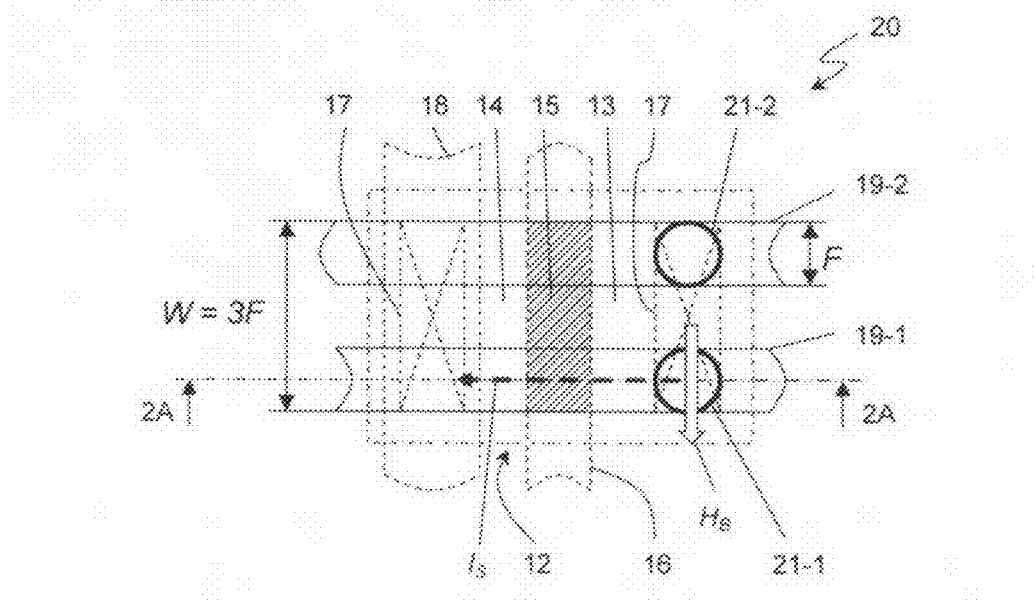
FIG. 2B is a schematic top-down view of the perpendicular MRAM cell of FIG. 2.

FIG. 2A show a schematic cross-sectional view of a memory cell 20 according to an embodiment of the present application. The cross-section is taken along line 2A-2A that is shown in the FIG. 2B. The memory cell 20 comprises a semiconductor substrate 11 with a selection transistor 12, a MTJ (or magnetoresistive) element 21, a word line 16 and a bit line 19; the lines 16 and 19 overlap each other. The MTJ element 21 comprises a pinned layer 22 with a fixed magnetization direction (shown by an arrow) directed substantially perpendicular to a layer plane, a free layer 23 with a changeable magnetization direction (shown by two arrows) directed substantially perpendicular to a layer plane in its equilibrium state, a tunnel barrier layer 24 sandwiched between the pinned 22 and free 23 layers, a seed layer 26 and a cap layer 27. The free layer 23 has two stable directions of the magnetization in its equilibrium state: up or down. The MTJ element 21 is electrically connected to the bit line 19 and to the source region 13 of the transistor 12 through a contact plug 17. The word line 16 is coupled to the gate region 15 through an insulator layer (not shown). The memory cell 20 comprises two MTJ elements 21-1 and 21-2, and two parallel bit lines 19-1 and 19-2. The MTJ element 21-1 is electrically connected to the line 19-1 at one end adjacent to the free layer 23. Respectively, the MTJ element 21-2 is connected to the line 19-2. Both the MTJ elements at their second ends are jointly connected to the source region 13 of the transistor 12 through the contact plug 17. The transistor 12 has a footprint size comparable with the size of the cell 20 (shown by a dash-dot line) and the gate width of about W=3F, where F is a diameter of the MTJ elements. The large gate width W provides the transistor 12 with a high saturation current, which is important for high-speed writing.

The memory cell 20 has a 1T-2MTJ (one transistor-two MTJs) design. Number of the MTJ elements in the cell 20 can be any. Each MTJ element of the memory cell 20 has a unique combination of the bit and word lines that provides its selection in the MRAM array. For instance, to write data to the MTJ element 21-1 the bias current $I_B$ needs to be run in the bit line 19-1 and the spin-polarized current $I_s$ should run through the element in direction perpendicular to its plane. The spin-polarized current $I_s$ is controlled by the word line 16 that intersects the bit line 19-1 in vicinity of the MTJ element 21-1. Combined effect of the bias $I_B$ and spin-polarized $I_s$ currents can reverse the magnetization direction in the free layer 23 of the element 21-1.

Figure 3:
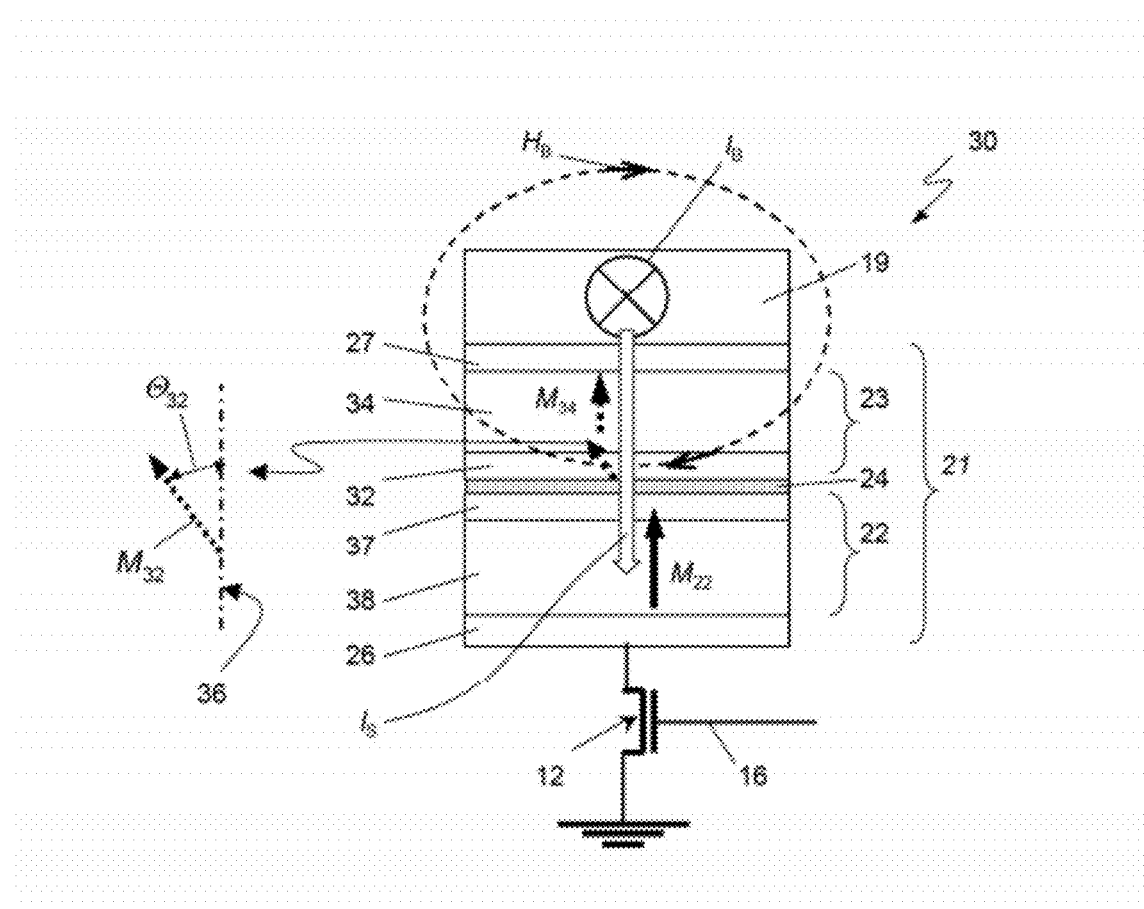
FIG. 3 is a schematic view of a perpendicular MRAM cell with a bilayer structure of free and pinned layers according to another embodiment of the present application.

In some embodiments the MTJ element 21 has a multilayer structure of the pinned 22 and free 23 layers. The FIG. 3 illustrates a memory cell 30 according to another embodiment with a bilayer structure of the pinned 22 and free 23 layers. The free layer 23 comprises a storage layer 34 having a perpendicular anisotropy and a first coercivity, and a soft magnetic underlayer 32 having a second coercivity. The soft magnetic underlayer 32 is disposed between the tunnel barrier layer 24 and the storage layer 34 and is substantially magnetically coupled to the storage layer 34. The coercivity of the storage layer 34 is significantly higher than the coercivity of the soft magnetic underlayer 32. The pinned layer 22 comprises the reference layer 38 with a perpendicular anisotropy and a third coercivity, and a spin-polarizing layer 37 with a fourth coercivity. The coercivity of the reference layer 38 is substantially higher than the coercivity of the storage layer 34. The spin-polarizing layer 37 is disposed between the tunnel barrier layer 24 and the reference layer 38 and is substantially magnetically coupled to the reference layer 38. The soft magnetic underlayer 32 can be made of a soft magnetic material with perpendicular or in-plane crystalline anisotropy. However due to a strong magnetic coupling to the storage layer 34 the orientation of magnetization in the soft magnetic underlayer 32 can be maintained perpendicular to layer plane in its equilibrium state.

A pulse of the bias current $I_B$ running in the bit line 19 induces a bias magnetic field $H_B$ that is applied to the free layer 23 along its hard axis. The field $H_B$ tilts the magnetization $M_{32}$ in the soft magnetic underlayer 32 on the angle $\Theta_{32}$ but does not change the direction of the magnetizations $M_{22}$ and $M_{34}$ in the pinned 22 and storage 34 layers, respectively. The angle $\Theta_{32}$ depends on the bias current magnitude, on thickness and magnetic properties of the soft magnetic underlayer 32 and the storage layer 34, and on the strength of the magnetic coupling between them. Tilting of the magnetization $M_{32}$ in the soft magnetic underlayer 32 provides a significant reduction of the magnitude of spin-polarized current pulse $I_s$ that is required to reverse the magnetization direction in the storage layer 34. The spin-polarizing layer 37 offers a high spin polarization of the switching current that is also important for reduction of $I_s$ magnitude. The material of the spin-polarizing layer can have perpendicular or in-plane anisotropy. The direction of magnetization in the spin polarizing layer 37 does not change under the bias field $H_B$ due to its strong magnetic coupling with the reference layer 38. The magnetizations directions in the soft magnetic underlayer 32 and in the spin-polarizing layer 37 are substantially collinear (parallel or anti-parallel) in the equilibrium state. That is important for providing a high output signal during read operation. The saturation current of the transistor 12 does not limit the magnitude of the spin-polarized current $I_s$ since the transistor has a large gate width W. At the same time, the bias field $H_B$ offers a significant reduction of the spin-polarized current $I_s$ and an additional opportunity of the write speed increase.

Figure 4A:
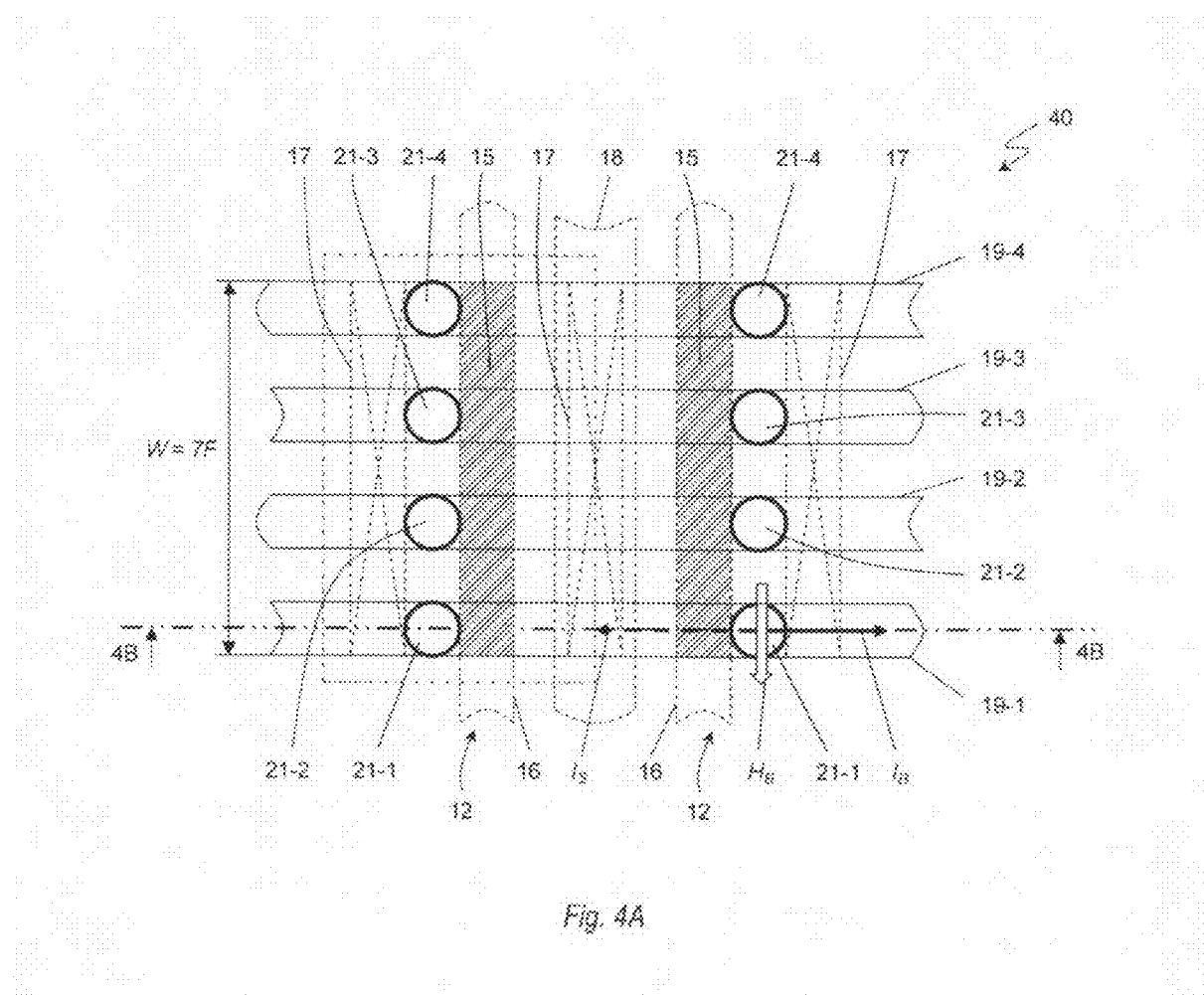
FIG. 4A. is a schematic top-down view of two adjacent MRAM cells according to yet another embodiment of the present application.
Figure 4B:
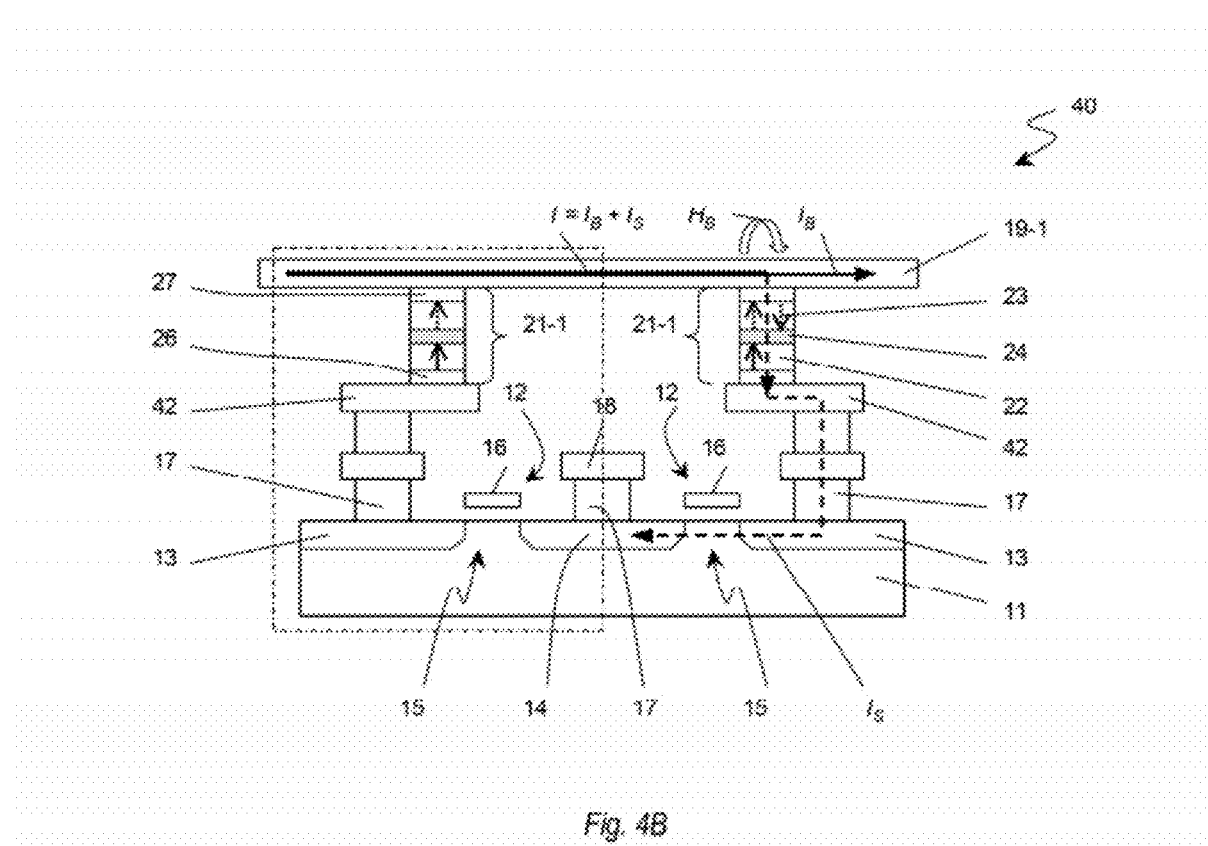
FIG. 4B is a schematic cross-sectional view of two adjacent MRAM cells of FIG. 4A.

FIGS. 4A and 4B illustrate two memory cells 40 according to yet another embodiment of the present application wherein one of the cells is shown by a dash-dot line. The cells have a common ground line 18 connected to the common drain region 14 of two selection transistors 12. Footprints of the selection transistor 12 and the memory cell 40 coincide. The cells 40 have 1T-4MTJ design with four MTJ elements 21-1, 21-2, 21-3 and 21-4, and four parallel bit lines 19-1, 19-2, 19-3 and 19-4 separately connected to the appropriate elements at their second ends adjacent to the free layer 23. All MTJ elements of the memory cells 40 are jointly connected at their first ends adjacent to the pinned layer 24 with the source region 13 of the proper transistor 12 through the contact plug 17. Selection of a MTJ element in the MRAM array is provided by unique combination of bit and word lines overlapping at the MTJ location. The transistors 12 have a gate width of about W=7F and can deliver a considerable spin-polarized current to the MTJ elements 21 for high-speed writing.

FIG. 4B shows a schematic cross-sectional view of the cells 40 given in FIG. 4A. The cross section was taken along 4B-4B line. Elements of the cells 40 have functions similar to those in FIGS. 2A and 2B. Each of the cells 40 additionally includes a local conductor line 42. The MTJ elements 21 of the memory cell 40 are jointly electrically connected to the source region 13 of the proper transistor 12.

Figure 5:
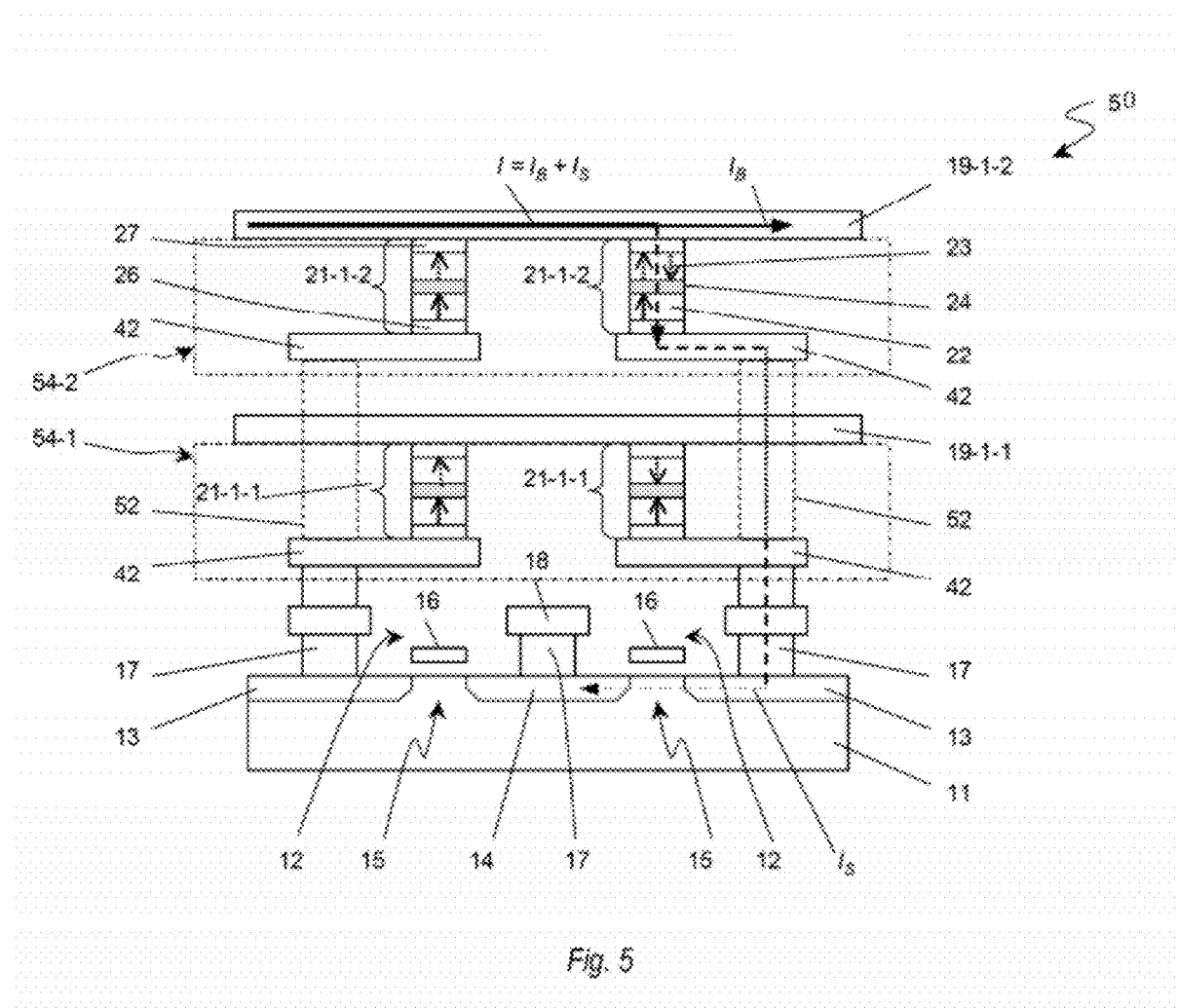
FIG. 5 is a schematic cross-sectional view of a three dimensional perpendicular MRAM with two memory layers according to yet another embodiment of the present application.

FIG. 5 shows a schematic cross sectional view of two cells 50 of three-dimensional MRAM according to yet another embodiment of the present application. Each of the cells 50 comprises two memory layers 54-1 and 54-2 that include a plurality of MTJ elements 21, and two conductor layers disposed above the memory layers 54-1 and 54-2. Each of the conductor layers comprises a plurality of parallel bit lines 19. The bit lines 19 disposed in the different conductor layers are parallel to each other and overlap the word lines 16. Selection of the MTJ in the 3D-MRAM is provided by a unique combination of the word line 16, the bit line 19 and the memory layer. Elements of the cells 50 have functions similar to those in the FIGS. 2A and 2B. The three-dimensional memory cell 50 provides a possibly of substantial MRAM density increase. The MTJ elements of the 3D-MRAM can have different interconnection schemes.

Figure 6:
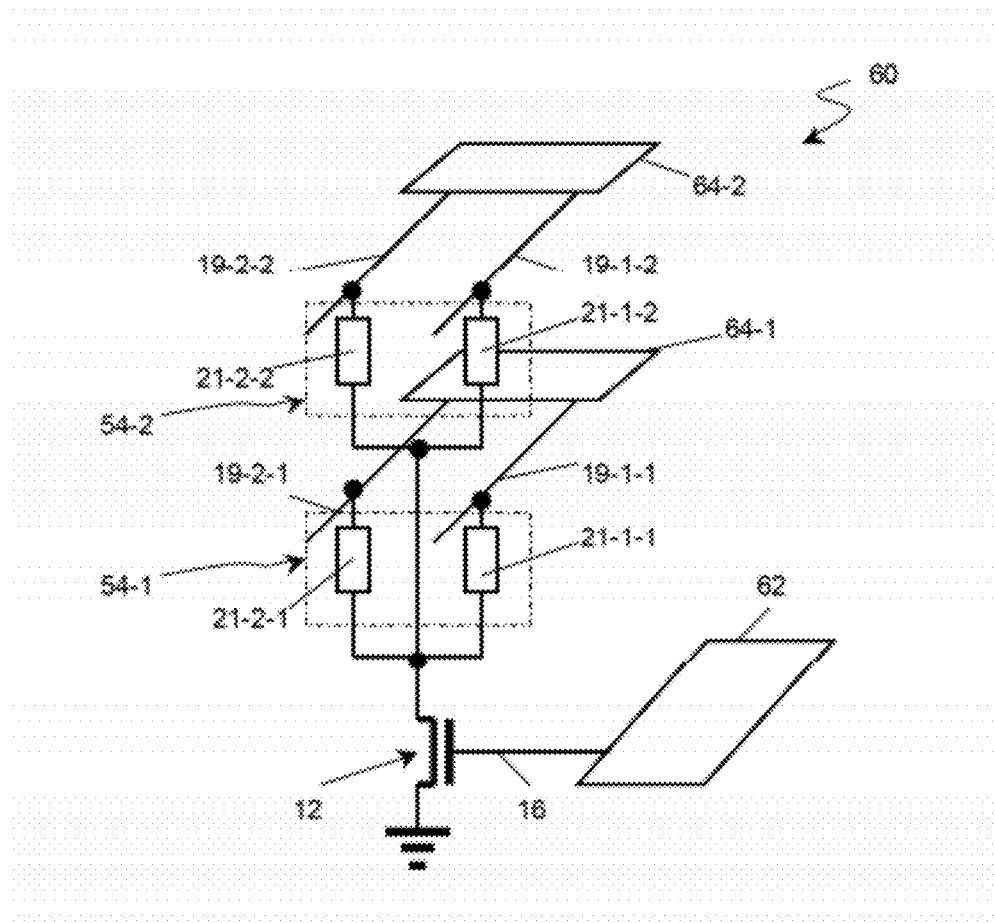
FIG. 6 is a circuit diagram illustrating a first interconnection scheme between magnetoresistive elements and a selection transistor in a three-dimensional MRAM cell.

FIG. 6 shows a circuit diagram of 3D-memory cell 60 according to still another embodiment of the present application. The memory cell 60 has 1T-2MTJ-2L design, where 2are two memory layers. It includes one selection transistor 12, two MTJ elements 21 per memory layer and two memory layers 54-1 and 54-2. The number of MTJ elements in the memory layer and the number of memory layers can be any. All MTJ elements 21 of the memory cell 60 are jointly connected to the source of the selection transistor 12 at their first ends that are adjacent to the pinned layers 22 and separately connected to an appropriate word line 19 at their second ends that are adjacent to the free layer 23 (FIG.5). The word line 16 is connected to a word line circuitry 62. The bit lines 19 are connected to the bit line circuitry 64. The bit line circuitry can includes several bit line drivers with one driver per conductor layer. For instance, the lines 19-1-1 and 19-2-1 of the bottom conductor layer are connected to the bit line driver 64-1 and the bit lines 19-1-2 and 19-2-2 of the top conductor layer are connected to the bit line driver 64-2. The number of the bit line drivers can be any.

Figure 7:
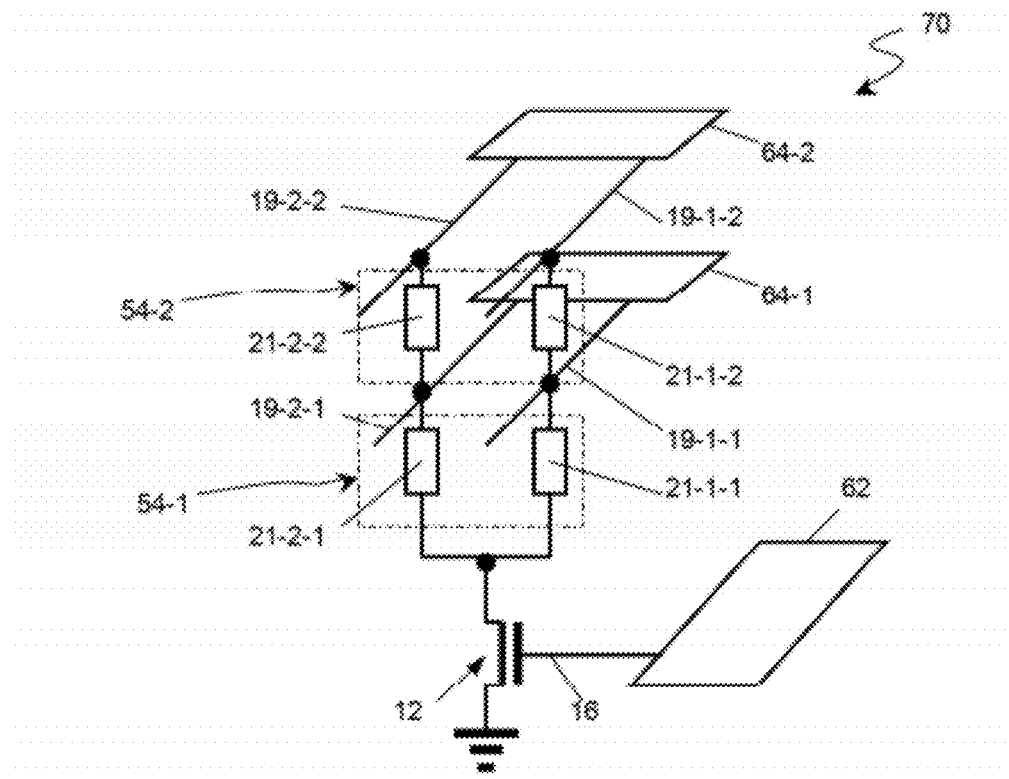
FIG. 7 is a circuit diagram illustrating a second interconnection scheme between magnetoresistive elements and a selection transistor in a three-dimensional MRAM cell.

FIG. 7 shows a circuitry diagram of 3D-memory cell 70 according to still another embodiment of the present application. The memory cell 70 has 1T-2MTJ-2L design but distinguishes from the cell 60 shown in the FIG. 6 by electrical connection between the overlaying MTJ elements 19 of the different memory layers 54-1 and 54-2. The MTJ elements 19 of the layers 54-1 and 54-2 are connected in series to each other to form columns of the MTJ elements. The columns of the MTJ elements are jointly connected to the selection transistor 12.

There is wide latitude for the choice of materials and their thicknesses within the embodiments.

The pinned layer 22 has a thickness of about 10-100 nm and more specifically of about 25-50 nm and coercivity measured along its easy axis above 1000 Oe and more specifically of about 2000-5000 Oe. The layer 22 is made of magnetic material with perpendicular anisotropy such as Co, Fe or Ni-based alloys or their multilayers such as Co/Pt, Co/Pd, Co/Au, CoFe/Pt, Fe/Pt, Fe/Pd, Ni/Cu or similar.

The free layer 23 has a thickness of about 1-30 nm and more specifically of about 5-15 nm and coercivity less than 1000 Oe and more specifically of about 100-300 Oe. The layer 23 is made of soft magnetic material with perpendicular anisotropy such as Co, Fe or Ni-based alloys or multilayers such as Co/Pt, Co/Pd, Co/Au, CoFe/Pt, Fe/Pt, Fe/Pd, Ni/Cu or similar.

The tunnel barrier layer 24 has a thickness of about 0.5-25 nm and more specifically of about 0.5-1.5 nm. The tunnel barrier layer is made of MgO, $Al_2O_3$, $Ta_2O_5$, $TiO_2$, Mg—MgO and similar materials or their based laminates.

The seed 26 and cap 27 layers have a thickness of 1-100 nm and more specifically of about 5-25 nm. The layers are made of Ta, W, Ti, Cr, Ru, NiFe, NiFeCr, PtMn, IrMn or similar conductive materials or their based laminates.

The conductor lines 18 and 19 are made of Cu, Al, Au, Ag, AlCu, Ta/Au/Ta, Cr/Cu/Cr and similar materials or their based laminates.

The soft magnetic underlayer 32 is 0.5-5 nm thick and is made of a soft magnetic material with a substantial spin polarization and coercivity of about 1-200 Oe such as CoFe, CoFeB, NiFe, Co, Fe, CoPt, FePt, CoPtCu, FeCoPt and similar or their based laminates such as CoFe/Pt, CoFeB/Pd and similar. The material of the soft magnetic underlayer 74 can have either in-plane or perpendicular anisotropy.

The storage layer 34 has a thickness of 5-25 nm and more specifically of about 8-15 nm; and coercivity less than 1000 Oe and more specifically of about 200-500 Oe. The storage layer 76 is made of magnetic material with a substantial perpendicular anisotropy such as Co, Fe or Ni-based alloys or multilayers such as Co/Pt, Co/Pd, Co/Au, CoFe/Pt, Fe/Pt, Fe/Pd, Ni/Cu or similar.

The spin-polarizing layer 37 has a thickness of 0.5-5 nm and is made of a soft magnetic material with a coercivity of about 1-200 Oe and a substantial spin polarization such as CoFe, CoFeB, NiFe, Co, Fe, CoPt, FePt, CoPtCu, FeCoPt and similar or their based laminates such as CoFe/Pt, CoFeB/Pd and similar. The material of the spin-polarizing layer 37 can have either in-plane or perpendicular anisotropy.

The reference layer 38 has a thickness of 10-100 nm and more specifically of about 20-50 nm; and coercivity above 1000 Oe and more specifically of about 2000-5000 Oe. The reference layer 38 is made of magnetic material with a substantial perpendicular anisotropy such as Co, Fe or Ni-based alloys or multilayers such as Co/Pt, Co/Pd, Co/Au, CoFe/Pt, Fe/Pt, Fe/Pd, Ni/Cu or similar.

It is understood that the above description is intended to be illustrative, and not restrictive. Many other embodiments will be apparent to those of skill in the art upon reviewing the above description. The scope of the application should be, therefore, determined with reference to the appended claims, along with the full scope of equivalents to which such claims are entitled.

What is claimed is:

1. A magnetic random access memory comprising:
   a transistor comprising a gate width, the transistor is formed on a substrate and is electrically coupled to a word line;
   a plurality of memory layers sequentially disposed above the substrate, each memory layer comprising a plurality of magnetoresistive elements, each magnetoresistive element comprising an element width, a pinned layer comprising a fixed magnetization direction directed substantially perpendicular to the substrate, a free layer comprising a reversible magnetization direction directed substantially perpendicular to the substrate in its equilibrium state, and a tunnel barrier layer residing between the pinned layer and the free layer;
   a plurality of conductor layers disposed alternately with the memory layers beginning with a memory layer positioned adjacent to the substrate, each conductor layer comprising a plurality of parallel bit lines overlapping the word line, the plurality of bit lines being disposed adjacent to the free layer and independently electrically coupled to the plurality of magnetoresistive elements at first terminals;
   wherein the gate width is substantially larger than the element width, and
   wherein the plurality of magnetoresistive elements are jointly electrically coupled to the transistor at second terminals.

2. The magnetic random access memory of claim 1, further comprising:
   a word line circuitry electrically coupled to the word line, and
   a bit line circuitry electrically coupled to the plurality of conductor layers.

3. The magnetic random access memory of claim 2, wherein the bit line circuitry further comprises a plurality of bit line drivers independently electrically coupled to the plurality of conductor layers.

4. The magnetic random access memory of claim 1, wherein superimposed magnetoresistive elements of different memory layers are connected in series with each other.

5. The magnetic random access memory of claim 1, wherein the free layer further comprises:
   a storage layer comprising a perpendicular anisotropy and a first coercivity, and
   a soft magnetic layer comprising a second coercivity, the soft magnetic layer is disposed between the tunnel barrier layer and the storage layer,
   wherein the soft magnetic layer is substantially magnetically coupled to the storage layer, and
   wherein the first coercivity is substantially larger than the second coercivity.

6. The magnetic random access memory of claim 5, wherein the soft magnetic layer further comprises a magnetic material comprising an in-plane anisotropy.

7. The magnetic random access memory of claim 1, wherein the pinned layer further comprises:

a reference layer comprising a perpendicular anisotropy, and a spin-polarizing layer disposed between the tunnel barrier layer and the reference layer, wherein the spin-polarizing layer is substantially magnetically coupled to the reference layer.

8. The random access memory of claim 7, wherein the spin-polarizing layer further comprises a magnetic material comprising an in-plane anisotropy.

9. A method of writing to a magnetic random access memory comprising:

provide a transistor disposed on a substrate and comprising a gate width, a word line electrically coupled to the transistor, a plurality of memory layers disposed above the substrate, each memory layer comprising a plurality of magnetoresistive elements, each magnetoresistive element comprising an element width, a pinned layer comprising a fixed magnetization direction directed perpendicular to the substrate, a free layer comprising a reversible magnetization direction directed perpendicular to the substrate in its equilibrium state, and a tunnel barrier layer residing between the pinned and free layers; a plurality of conductor layers, each conductor layer comprising a plurality of parallel bit lines overlapping the word line, adjacent conductor layers are spaced from each other by a memory layer, the plurality of magnetoresistive elements independently electrically coupled to the plurality of bit lines at first terminals and jointly electrically coupled to the transistor at second terminals, wherein the gate width is substantially larger than the element width;

driving a bias current pulse through a bit line in a proximity to but not through a magnetoresistive element and producing a bias magnetic field along a hard magnetic axis of the free layer;

driving a spin-polarized current pulse through the magnetoresistive element along an easy axis of the free layer and producing a spin momentum transfer;

whereby the magnetization direction in the free layer is reversed by a joint effect of the substantially superimposed pulses of the bias and spin-polarized currents.

10. The method of claim 9, further comprising:

a word line circuitry electrically coupled to the word line, and a plurality of bit line drivers independently electrically coupled to the plurality of conductor layers.

11. The method of claim 9, wherein superimposed magnetoresistive elements residing in different memory layers are connected in series with each other.

12. The method of claim 9, wherein the free layer further comprises:

a storage layer comprising a perpendicular anisotropy and a first coercivity, and a soft magnetic layer comprising a second coercivity, the soft magnetic layer is disposed between the tunnel barrier layer and the storage layer, wherein the soft magnetic layer is substantially magnetically coupled to the storage layer, and wherein the first coercivity is substantially larger than the second coercivity.

13. The method of claim 12, wherein the soft magnetic layer further comprises a magnetic material comprising an in-plane anisotropy.

14. The method of claim 9, wherein the pinned layer further comprises:

a reference layer comprising a perpendicular anisotropy, and a spin-polarizing layer comprising disposed between the tunnel barrier layer and the reference layer, wherein the spin-polarizing layer is substantially magnetically coupled to the reference layer.

15. The method of claim 14 wherein the spin-polarizing layer further comprises a magnetic material comprising an in-plane anisotropy.

* * * * *